(12) United States Patent
Lin

(10) Patent No.: US 10,320,385 B2
(45) Date of Patent: Jun. 11, 2019

(54) VARIABLE CODING METHOD FOR REALIZING CHIP REUSE AND COMMUNICATION TERMINAL THEREFOR

(71) Applicant: Vanchip (Tianjin) Technology Co., Ltd., Tianjin (CN)

(72) Inventor: Sheng Lin, Tianjin (CN)

(73) Assignee: Vanchip (Tianjin) Technology Co., Ltd., Tianjin (CN)

( * ) Notice: Subject to any disclaimer, the term of this patent is extended or adjusted under 35 U.S.C. 154(b) by 0 days.

(21) Appl. No.: 15/780,242

(22) PCT Filed: Nov. 30, 2016

(86) PCT No.: PCT/CN2016/108174
§ 371 (c)(1),
(2) Date: May 31, 2018

(87) PCT Pub. No.: WO2017/092683
PCT Pub. Date: Jun. 8, 2017

(65) Prior Publication Data
US 2018/0351553 A1   Dec. 6, 2018

(30) Foreign Application Priority Data

Dec. 1, 2015  (CN) .......................... 2015 1 0872771

(51) Int. Cl.
*H03K 19/00* (2006.01)
*H04B 14/00* (2006.01)
(Continued)

(52) U.S. Cl.
CPC .... *H03K 19/0002* (2013.01); *H03K 19/00307* (2013.01); *H03K 19/08* (2013.01); *H03K 19/212* (2013.01); *H04B 14/00* (2013.01)

(58) Field of Classification Search
CPC .... H03K 19/0002; H03K 19/02; H03K 19/08; G11C 8/18; G01R 31/28; G01R 31/31726
(Continued)

(56) References Cited

U.S. PATENT DOCUMENTS 8,471,592 B1    6/2013  Hlebowitsh et al.
2001/0052097 A1* 12/2001  Miura ............... G01R 31/31937
                                                714/744
(Continued)

FOREIGN PATENT DOCUMENTS

CN   101068113   11/2007
CN   101615147   12/2009
(Continued)

OTHER PUBLICATIONS

International Search Report and the Written Opinion dated Mar. 2, 2017 From the International Searching Authority Re. Application No. PCT/CN2016/108174 and Its Translation of Search Report Into English. (9 pages).

*Primary Examiner* — Jason Crawford

(57) ABSTRACT

Disclosed is a variable coding method for realizing chip reuse, comprising the following steps: using at least two identical integrated circuit chips, wherein each integrated circuit chip executes different control logic truth tables according to different gating signals; introducing at least one logical control signal as a gating signal; and controlling the logical control signal, so that each integrated circuit chip respectively executes a corresponding control logic truth table. Also disclosed is a communication terminal using the variable coding method for realizing chip reuse. Two or more completely identical integrated circuit chips can be used to realize different logical control functions, thereby simplifying the type of a chip for realizing a system function, and greatly reducing the development costs of an
(Continued)

integrated circuit system and the management complexity of a mass production supply chain.

11 Claims, 6 Drawing Sheets

(51) Int. Cl.
    *H03K 19/003* (2006.01)
    *H03K 19/08* (2006.01)
    *H03K 19/21* (2006.01)

(58) Field of Classification Search
    USPC .................. 326/37–41, 47, 59; 365/191–193
    See application file for complete search history.

(56) References Cited

U.S. PATENT DOCUMENTS

| | | | | |
|---|---|---|---|---|
| 2002/0003433 A1* | 1/2002 | Housako | ............ | G01R 31/3193 324/762.01 |
| 2005/0135688 A1* | 6/2005 | Chen | .................... | H04N 19/647 382/240 |

FOREIGN PATENT DOCUMENTS

| | | |
|---|---|---|
| CN | 202661817 | 1/2013 |
| WO | WO 2017/092683 | 6/2017 |

\* cited by examiner

| | VC4 | VC3 | VC2 | VC1 |
|---|---|---|---|---|
| Sleep | 0 | 0 | 0 | 0 |
| LB1 | 0 | 0 | 0 | 1 |
| LB2 | 0 | 0 | 1 | 0 |
| LB3 | 0 | 0 | 1 | 1 |
| LB4 | 0 | 1 | 0 | 0 |
| LB5 | 0 | 1 | 0 | 1 |
| HB1 | 0 | 1 | 1 | 0 |
| HB2 | 0 | 1 | 1 | 1 |
| HB3 | 1 | 0 | 0 | 0 |
| HB4 | 1 | 0 | 0 | 1 |
| HB5 | 1 | 0 | 1 | 0 |

|       | VC4 | VC3 | VC2 | VC1 | Vctrl |
|-------|-----|-----|-----|-----|-------|
| Sleep | 0   | 0   | 0   | 0   | x     |
| LB1   | 0   | 0   | 0   | 1   | 0     |
| LB2   | 0   | 0   | 1   | 0   | 0     |
| LB3   | 0   | 0   | 1   | 1   | 0     |
| LB4   | 0   | 1   | 0   | 0   | 0     |
| LB5   | 0   | 1   | 0   | 1   | 0     |
| HB1   | 0   | 1   | 1   | 0   | 1     |
| HB2   | 0   | 1   | 1   | 1   | 1     |
| HB3   | 1   | 0   | 0   | 0   | 1     |
| HB4   | 1   | 0   | 0   | 1   | 1     |
| HB5   | 1   | 0   | 1   | 0   | 1     |

VARIABLE CODING METHOD FOR REALIZING CHIP REUSE AND COMMUNICATION TERMINAL THEREFOR

RELATED APPLICATIONS

This application is a National Phase of PCT Patent Application No. PCT/CN2016/108174 having International filing date of Nov. 30, 2016, which claims the benefit of priority of Chinese Patent Application No. 201510872771.4 filed on Dec. 1, 2015. The contents of the above applications are all incorporated by reference as if fully set forth herein in their entirety.

FIELD AND BACKGROUND OF THE INVENTION

The present invention relates to a variable coding method for realizing chip reuse, and further relates to a communication terminal for realizing chip reuse by using the variable coding method, belonging to the technical field of integrated circuits.

The pursuit of miniaturization, multi-functionality, low cost, and low power consumption for electronic products is endless, which makes process improvement and system integration become the two major trends in the semiconductor industry. At present, the wafer manufacturing industry, which focuses on process improvement, is still developing in accordance with Moore's Law. However, as the process dimension is further reduced, Moore's Law is gradually moving toward the limit.

System integration is an important technological approach for the semiconductor industry to surpass Moore's Law. At present, the system integration has three mainstream technologies: System in Package (SiP for short), System on Chip (SoC for short), and Three Dimension Integration Circuits (3D IC for short). Among them, the SiP technology refers to a plurality of chips with different functions and different processes, and some passive components and antennas integrated in a single package to form a three-dimensional multilayer complicated system with powerful system functions. Compared with the SoC technology and the 3D IC technology, the SiP technology has the advantages of high integration level, favorable process compatibility, low cost, high reliability and the like, and has broad application prospects and huge market demands.

With the increasing demand for miniaturization and diversification of functions of electronic devices, the integration level at the system level is required to be continuously improved. Therefore, the number of chips that need to be integrated to develop an integrated circuit system is also increasing. Since the cost of putting a chip into production is very high (its main cost is the cost of photolithography), this leads to an increase in the development cost of the integrated circuit system. In integrated circuit systems, there are often some similarities functions. If these similar functions can be realized by using a common chip, the number of different chips put into productions can be greatly reduced, thereby solving the problem of high development cost of the integrated circuit system.

In the manufacturing process of a communication terminal, an RF front-end module includes all components between the transceiver output and the antenna, and is an important part of the SiP. A miniaturized RF front-end module can greatly improve the integration level and reliability of the SiP. Therefore, the miniaturization of the RF front-end module has become a research hotspot in recent years. There are two trends in the miniaturization of RF front-end modules, namely a component reusable technology and an active inductance technology. The component reusable technology means that in a multimode/multiband chip, multiple transceivers share the same UWB low-noise amplifier, UWB-tuning-range oscillator or phase-locked loop, or the like. For example, Peregrine Semiconductor of the United States has developed a reconfigurable RF front-end module UltraCMOS Global. It solves the interoperability problem through high isolation between low-loss switching and tuning, and adapts to all modes and frequency bands in a digital control manner. However, the existing component reusable technology still has many defects such as limited application scope, difficulty in solving the anti-interference problem, and the like.

SUMMARY OF THE INVENTION

The primary technical problem to be solved by the present invention is to provide a variable coding method for realizing chip reuse.

Another technical problem to be solved by the present invention is to provide a communication terminal for realizing chip reuse by using the variable coding method.

In order to achieve the above objectives, the present invention adopts the following technical solution:

According to a first aspect of the embodiments of the present invention, a variable coding method for realizing chip reuse is provided, and comprises the following steps:

using at least two identical integrated circuit chips, wherein each of the integrated circuit chips executes a different control logic truth table according to different strobe signals;

introducing at least one logic control signal as the strobe signal; and controlling the logic control signal so as to enable each of the integrated circuit chips to execute the corresponding control logic truth table.

Preferably, the integrated circuit chip is any one of an RF switch chip, an RF amplifier chip, a power management chip or a power control chip.

Preferably, when the integrated circuit chip is packaged, the logic control signal is connected to a VDD end or GND end.

Preferably, when the integrated circuit chip is an RF switch chip, a non-inverting terminal of the logic control signal participates in the control of a high band coding section, and an inverting terminal participates in the control of a low band coding section.

Alternatively, when the integrated circuit chip is an RF switch chip, an inverting terminal of the logic control signal participates in the control of a high band coding section, and a non-inverting terminal participates in the control of a low band coding section.

Preferably, when the logic control signal is at a high level, the high band coding section operates normally, and the low band coding section is shielded; and when the logic control signal is at a low level, the high band coding section is shielded, and the low band coding section operates normally.

Preferably, the number of the RF switch chips is two, wherein a logic control signal pin of the first RF switch chip for high band RF signals is connected to the VDD end when being packaged; and a logic control signal pin of the second RF switch chip for low band RF signals is connected to the GND end when being packaged.

Preferably, an input end of the logic control signal is pulled up to the VDD end through a resistor, so that the logic control signal pin of the first RF switch chip applied to high band RF signals is suspended, and the logic control signal pin of the second RF switch chip is connected to the GND end.

Alternatively, an input end of the logic control signal is pulled down to the GND end through a resistor, so that the logic control signal pin of the second RF switch chip applied to low band RF signals is suspended, and the logic control signal pin of the first RF switch chip is connected to the VDD end.

Preferably, the resistor is a passive thin film resistor or a transistor in an appropriate bias state.

According to a second aspect of the embodiments of the present invention, a communication terminal is provided, and uses at least two identical integrated circuit chips to realize different logic control functions by using the variable coding method.

The variable coding method provided by the present invention can use two or more identical integrated circuit chips to realize different logic control functions, thereby simplifying the types of chips for realizing system functions, and greatly lowering the development cost of the integrated circuit system and the management complexity of the mass production supply chain.

DESCRIPTION OF SPECIFIC EMBODIMENTS OF THE INVENTION

The technical contents of the present invention will be described in detail below with reference to the accompanying drawings and specific embodiments.

First of all, it should be noted that, in various embodiments of the present invention, the related communication terminal refers to a computer device, including but not limited to a mobile phone, a notebook computer, a tablet computer, an on-board computer and the like, that can be used in a mobile environment and supports various communication systems such as GSM, EDGE, TD_SCDMA, TDD_LTE, FDD_LTE, and the like.

At present, the system complexity of RF front-end modules in a communication terminal is continuously increasing, resulting in correspondingly high development cost. In order to significantly lower the development cost of the integrated circuit system, the present invention provides a novel and unique variable coding method, which can realize different logic decoding functions by using two or more identical integrated circuit chips by introducing additional logic control bits under the condition of sharing the same type of integrated circuit chip, thereby obviously lowering the development and production costs of the integrated circuit chips.

The above integrated circuit chip may be any one of an RF switch chip, an RF amplifier chip, a power management chip, a power control chip or various other chips. As long as these integrated circuit chips conform to the condition that they have identical or similar main functions but the logic controls operated by them require different truth tables, all of them can use the variable coding method provided by the present invention to realize the reuse function of identical chips.

In the variable coding method provided by the present invention, the number of the used identical chips may be two, and may also be more than two; and the number of the introduced logic control signals may be one, and may also be two or more. By proper combination of high and low levels of two or more logic control signals, it is possible to control two, three, or at most four identical chips to operate normally under the definition of up to four different logic truth tables. Theoretically calculated, the three logic control signals can control up to eight identical chips at most to operate normally under the definition of eight different logic truth tables.

In the following, detailed descriptions will be made in conjunction with different embodiments.

Embodiment 1

Figures 1, 2:
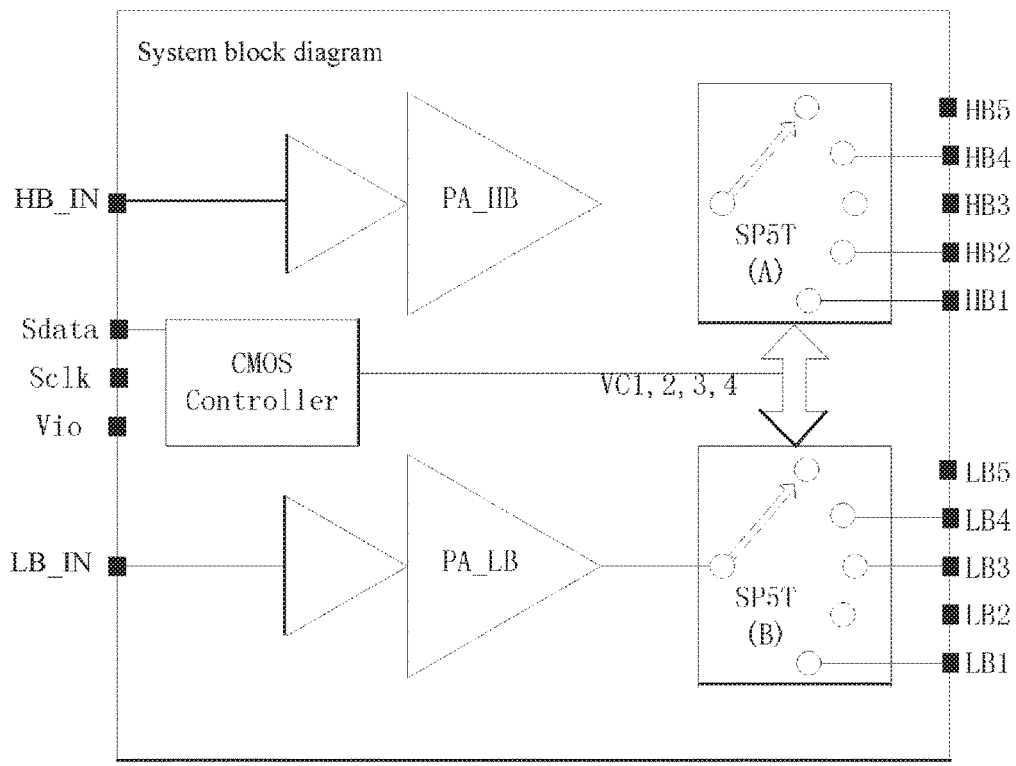
FIG. 1 is a system block diagram of an RF power amplifier and an RF switch module used by a certain communication terminal.
FIG. 2 is a control logic truth table defined by the integrated circuit system.

FIG. 1 is a system block diagram of an RF power amplifier (PA) and an RF switch module used by a certain communication terminal. In the drawing, the RF front end uses two single-pole five-throw (SPST) RF switch chips. The operating principles of the RF switch chips are the same, and the source (CMOS Controller) of the logic input signals VC1-VC4 used to control the RF switch chips is also the same. However, since the integrated circuit system requires that the two RF switch chips each perform the work of switching RF signals of different bands (for example, high band and low band), at the system level, they are two integrated circuit chips that are irreplaceable and must coexist, however, the only difference between them is that their control logic truth tables are different.

As shown in FIG. 2, the control logic truth table defined by the integrated circuit system for the high band (HB) and the low band (LB) is different. In order to realize these functions, two different decoding circuits are generally required, so that two different sets of light masks are required to produce two different RF switch chips.

Figures 3, 4:
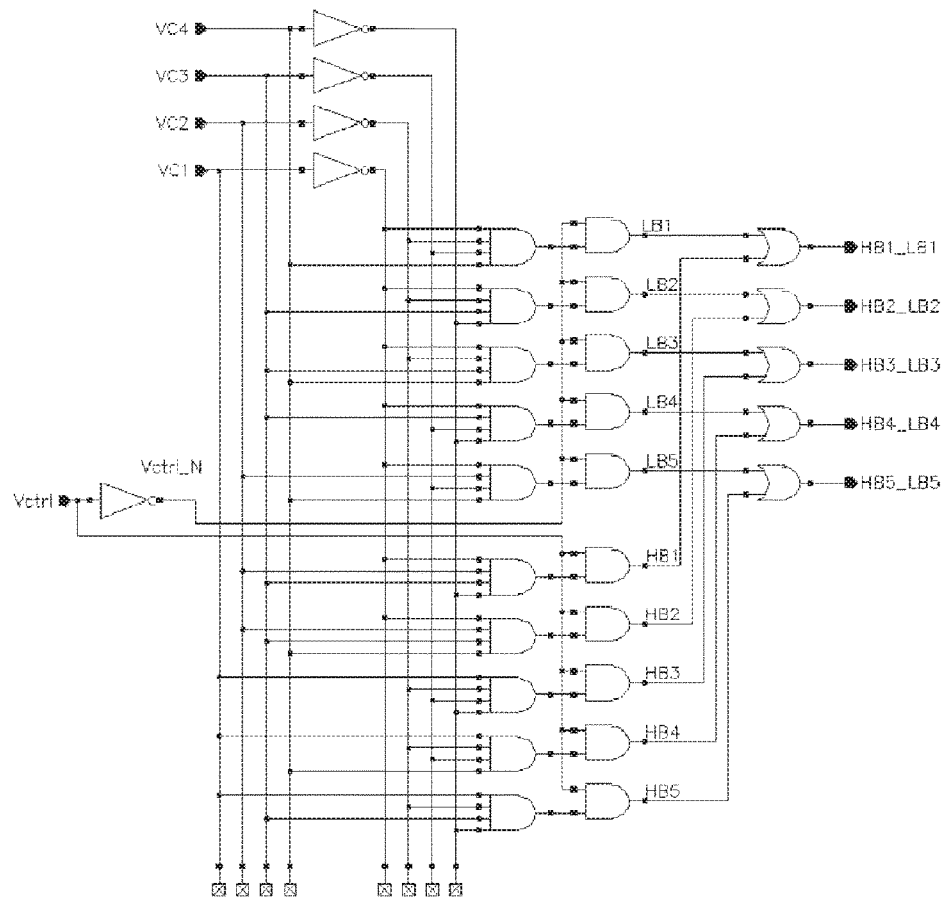
FIG. 3 is a modified control logic truth table in the present invention.
FIG. 4 is a circuit design example diagram for realizing the above control logic truth table.

As shown in FIG. 3, in order to fundamentally solve the above problems, a new logic control signal Vctrl is introduced in the present invention. This logic control signal Vctrl is not provided by the integrated circuit system, but is connected to the VDD end or the GND end by wire bonding according to the requirement of the integrated circuit system for the RF front-end module when the packaging of the RF switch chip shown in FIG. 1 is completed, so that the RF switch chip is fixedly set in applications that transmit high band (HB) or low band (LB). The above packaging may be wire bonding packaging, flip chip packaging, wafer level chip scale packaging or various other packaging methods, which will not be listed here.

When the logic control signal Vctrl is connected to the VDD end, the RF switch chip realizes the high band (HB)

logic decoding function; and when the logic control signal Vctrl is connected to the GND end, the RF switch chip realizes the low band (LB) logic decoding function. In this way, the same RF switch chip is used to realize different control logic truth table decoding functions, thereby achieving the objective of chip reuse, and fundamentally lowering the development cost of the other RF switch chip. In addition, the mass production supply chain management of the RF front-end module is simplified, and the development cost of the integrated circuit system is further lowered.

FIG. 4 is a circuit design example for realizing the control logic truth table shown in FIG. 3. In the RF switch module, the non-inverting terminal of the logic control signal Vctrl participates in the control of the high-band coding section (HB1 to HB5). When the logic control signal Vctrl is at a high level, the high band coding section operates normally, and the low band coding section is shielded; in contrast, the inverting terminal Vctrl_N of the logic control signal Vctrl participates in the control of the low-band coding section (LB1 to LB5). When the logic control signal Vctrl is at a low level, the high band coding section is shielded, and the low band coding section operates normally. In this way, different logic decoding functions are realized on the same chip. The above logic control signal can also be used in reverse, i.e., the inverting terminal participates in the high band coding section (HB1 to HB5) and the non-inverting terminal participates in the low band coding section (LB1 to LB5). At this time, the control logic truth table needs to be modified accordingly.

Figure 5:
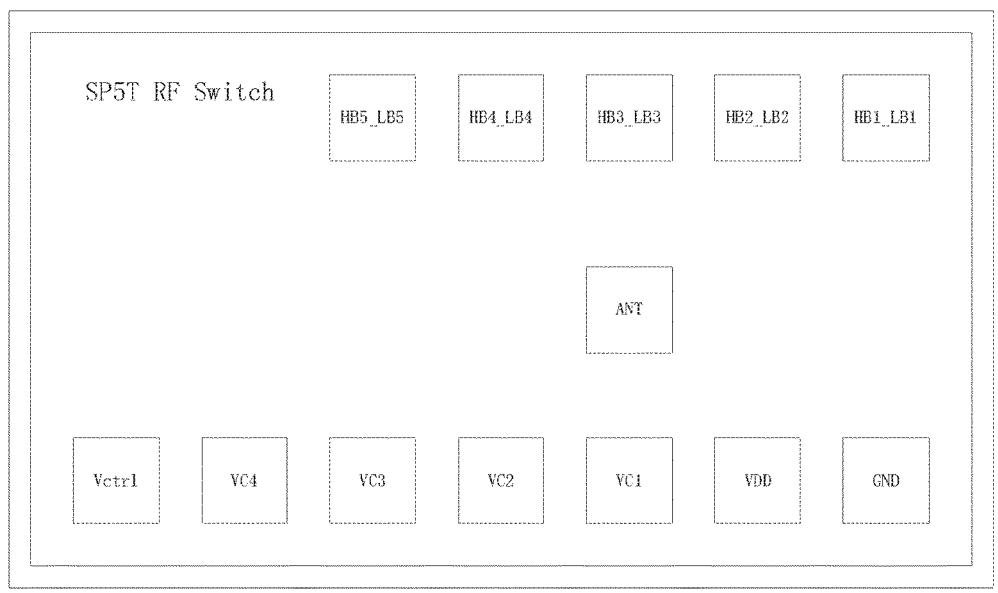
FIG. 5 is a layout design schematic diagram of an SPST RF switch chip in the present invention.

FIG. 5 is a layout design schematic diagram of an SPST RF switch chip after adding a logic control signal Vctrl. In the drawing, the high band coding section and the low band coding section share an output pad (PAD), and here, the sharing of HB_n and LB_n is taken as an example (n is a number of 1 to 5). Vctrl is a logic control truth table selection end; VC4-1 are logic truth table input ends; VDD and GND are power and ground ends respectively; ANT is the common end of the switches and corresponds to the output end of the RF power amplifier in FIG. 1; and the remaining 5 ports are switch routing ends, wherein high-frequency signals are transmitted between the ANT and any one of the routing ends.

It should be noted that the shared output pad manner mentioned in embodiment 1 is operated according to the demand for the RF front-end module pin defined by the circuit system. According to the changes in the specific requirements of the integrated circuit system, this shared output manner can be arbitrarily combined and changed, and can be specifically implemented by updating the control logic truth table shown in FIG. 2.

Figure 6:
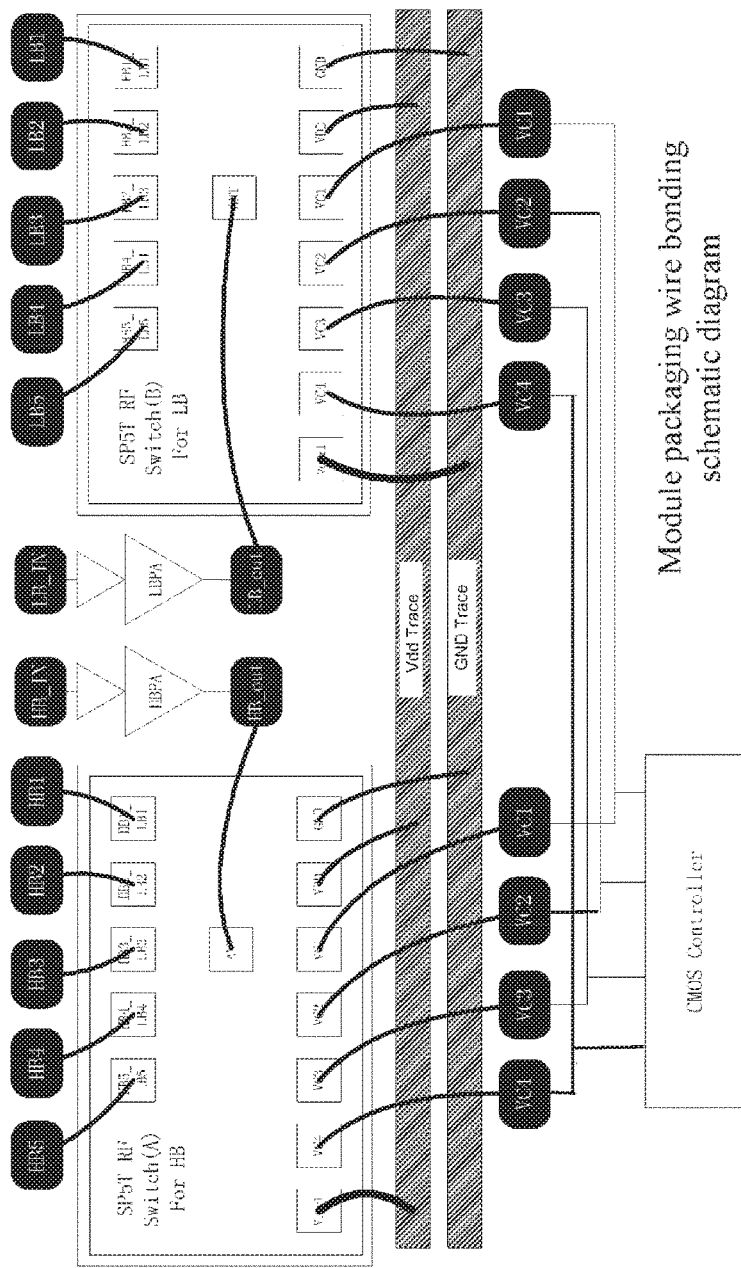
FIG. 6 is a system integrated connection schematic diagram according to embodiment 1 in the present invention.

FIG. 6 is a system integrated connection schematic diagram according to embodiment 1. Referring to FIG. 6, the Vctrl pin of the RF switch chip A for switching the high band (HB) RF signals is connected to the power (VDD) end by wire bonding, so that the RF switch chip A is configured to operate according to the high band (HB) section of the control logic truth table in FIG. 3; and the Vctrl pin of the RF switch chip B for switching low band (LB) RF signals is connected to the ground (GND) end by wire bonding, so that the RF switch chip B is configured to operate according to the low band (LB) section of the control logic truth table in FIG. 3.

Embodiment 2

Figure 7:
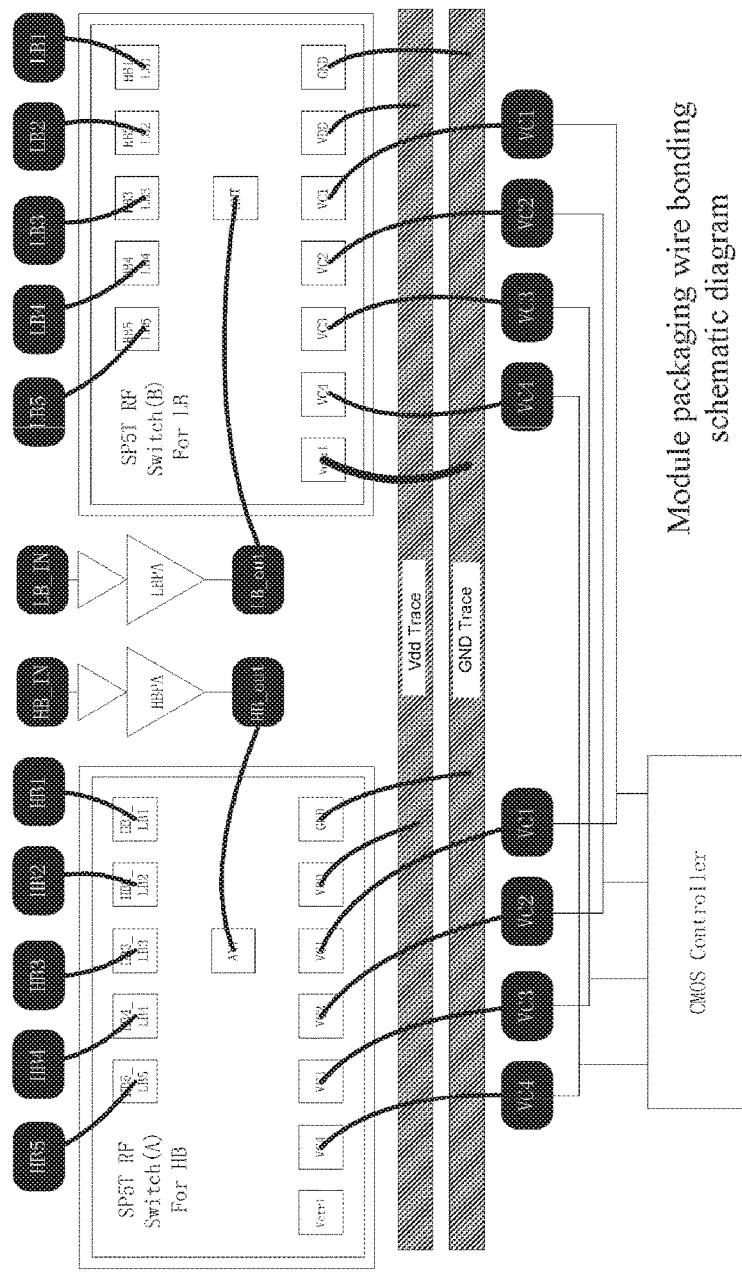
FIG. 7 is a system integrated connection schematic diagram according to embodiment 2 in the present invention.

As shown in FIG. 7, in another embodiment of the present invention, the input end of the logic control signal Vctrl is pulled up to the power (VDD) end by a slightly larger resistor in the circuit design stage, so that the Vctrl pin of the RF switch chip A applied to high band (HB) RF signals can be suspended (it is not necessary to connect it to a fixed level in the packaging stage.). At this time, it is only necessary to connect the Vctrl pin of the RF switch chip B to the ground (GND) end, thereby reducing the wire bonding to the power (VDD) end.

The pull-up resistor referred to here is not limited to a passive thin film resistor, but may also be various types of transistors in an appropriate bias state. The choice of its resistance or equivalent resistance needs to be considered in a compromise: it is necessary to consider the strength of the pull-up to resist interference, which requires that the pull-up resistor cannot be too large; and it is also necessary to consider that when the pull-up control end is externally wire-bonded to the ground (GND) end, the value of the DC current flowing from the power (VDD) end through the pull-up resistor to the ground (GND) end cannot be too large, which requires that the pull-up resistor cannot be too small. The value of the DC current can be calculated through the static power consumption index in the circuit system design.

Embodiment 3

Figure 8:
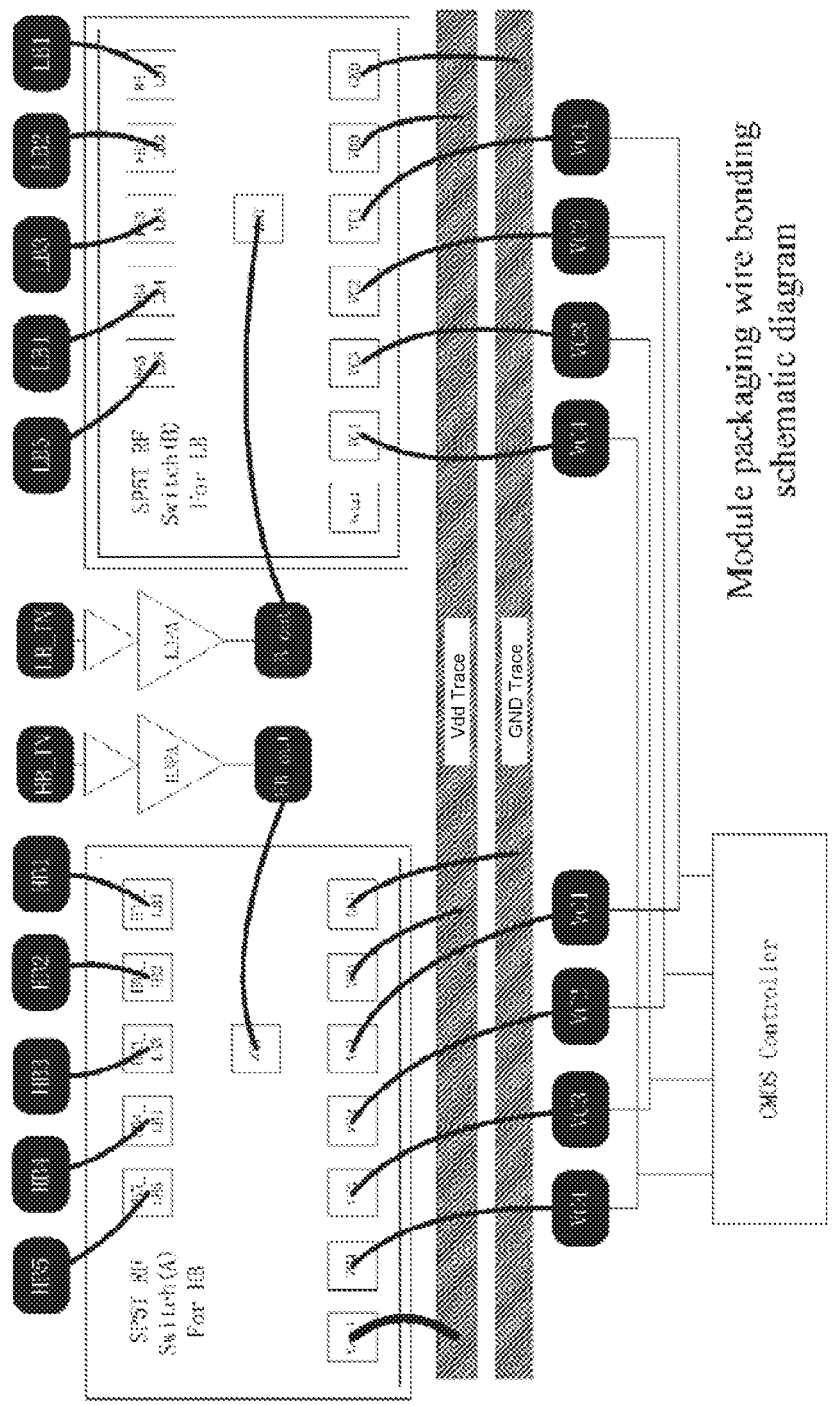
FIG. 8 is a system integrated connection schematic diagram according to embodiment 3 in the present invention.

As shown in FIG. 8, in still another embodiment of the present invention, the input end of the logic control signal Vctrl is pulled down to the ground (GND) end by a slightly larger resistor, so that the Vctrl pin of the RF switch chip B applied to low band (LB) RF signals can be suspended (it is not necessary to connect it to a fixed level in the packaging stage.). At this time, it is only necessary to connect the Vctrl pin of the RF switch chip A to the power (VDD) end, thereby reducing the wire bonding to the ground (GND) end.

The pull-down resistor referred to here is not limited to a passive thin film resistor, but may also be various types of transistors in an appropriate bias state. The choice of its resistance or equivalent resistance needs to be considered in a compromise: it is necessary to consider the strength of the pull-down to resist interference, which requires that the pull-down resistor cannot be too large; and it is also necessary to consider that when the pull-down control end is externally wire-bonded to the power (VDD) end, the value of the DC current flowing from the power (VDD) end through the pull-down resistor to the ground (GND) end cannot be too large, which requires that the pull-down resistor cannot be too small. The value of the DC current can be calculated through the static power consumption index in the circuit system design.

Embodiment 4

In yet another embodiment of the present invention, a communication terminal for realizing chip reuse by using the variable coding method is further provided. The communication terminal refers to a computer device, including a mobile phone, a notebook computer, a tablet computer, an on-board computer and the like, that can be used in a mobile environment and supports various communication systems such as GSM, EDGE, TD_SCDMA, TDD_LTE, FDD_LTE, and the like. In the communication terminal, two or more identical integrated circuit chips may be used to realize different logic control functions by the variable coding method. The other components of the communication terminal can be realized by using the prior art and will not be specifically described herein.

Compared with the prior art, the variable coding method provided by the present invention can use two or more identical integrated circuit chips to realize different logic control functions, thereby simplifying the types of chips for realizing system functions, and greatly lowering the development cost of the integrated circuit system and the management complexity of the mass production supply chain.

The variable coding method for realizing chip reuse and the communication terminal therefor provided by the present invention are described in detail above. For a person of ordinary skill in the art, any obvious changes made to the present invention without departing from the essential spirit of the present invention will constitute an infringement of the patent right of the present invention, and the corresponding legal responsibility shall be assumed.

What is claimed is:

1. A variable coding method for realizing chip reuse, wherein comprising the following steps:
   using at least two identical integrated circuit chips, wherein each of the integrated circuit chips executes a different control logic truth table according to different strobe signals;
   introducing at least one logic control signal as the strobe signal, when the integrated circuit chip is an RF switch chip, a non-inverting terminal of the logic control signal participates in the control of a high band coding section, and an inverting terminal participates in the control of a low band coding section; and
   controlling the logic control signal so as to enable each of the integrated circuit chips to execute the corresponding control logic truth table.

2. The variable coding method of claim 1, wherein when the integrated circuit chip is packaged, the logic control signal is connected to a VDD end or GND end.

3. The variable coding method of claim 1, wherein when the logic control signal is at a high level, the high band coding section operates normally, and the low band coding section is shielded; and when the logic control signal is at a low level, the high band coding section is shielded, and the low band coding section operates normally.

4. The variable coding method of claim 1, wherein the number of the RF switch chips is two, wherein a logic control signal pin of the first RF switch chip for high band RF signals is connected to the VDD end when being packaged; and a logic control signal pin of the second RF switch chip for low band RF signals is connected to the GND end when being packaged.

5. The variable coding method of claim 4, wherein an input end of the logic control signal is pulled up to the VDD end through a resistor, so that the logic control signal pin of the first RF switch chip applied to high band RF signals is suspended, and the logic control signal pin of the second RF switch chip is connected to the GND end.

6. The variable coding method of claim 5, wherein the resistor is a passive thin film resistor or a transistor in an appropriate bias state.

7. The variable coding method of claim 4, wherein an input end of the logic control signal is pulled down to the GND end through a resistor, so that the logic control signal pin of the second RF switch chip applied to low band RF signals is suspended, and the logic control signal pin of the first RF switch chip is connected to the VDD end.

8. The variable coding method of claim 7, wherein the resistor is a passive thin film resistor or a transistor in an appropriate bias state.

9. A communication terminal, wherein in the communication terminal, at least two identical integrated circuit chips are used to realize different logic control functions by using the variable coding method of claim 1.

10. A variable coding method for realizing chip reuse, wherein comprising the following steps:
    using at least two identical integrated circuit chips, wherein each of the integrated circuit chips executes a different control logic truth table according to different strobe signals;
    introducing at least one logic control signal as the strobe signal, when the integrated circuit chip is an RF switch chip, an inverting terminal of the logic control signal participates in the control of a high band coding section, and a non-inverting terminal participates in the control of a low band coding section; and
    controlling the logic control signal so as to enable each of the integrated circuit chips to execute the corresponding control logic truth table.

11. A communication terminal, wherein in the communication terminal, at least two identical integrated circuit chips are used to realize different logic control functions by using the variable coding method of claim 10.

* * * * *